United States Patent [19]
Paoli

[11] Patent Number: 5,267,255
[45] Date of Patent: Nov. 30, 1993

[54] ARRAY AND METHOD OF OPERATING A MODULATED SOLID STATE LASER ARRAY WITH REDUCED THERMAL CROSSTALK

[75] Inventor: Thomas L. Paoli, Los Altos, Calif.

[73] Assignee: Xerox Corporation, Stamford, Conn.

[21] Appl. No.: 841,399

[22] Filed: Feb. 25, 1992

[51] Int. Cl.$^5$ .............................................. H01S 3/19
[52] U.S. Cl. ...................................... 372/50; 372/26; 372/29
[58] Field of Search .................. 372/50, 26, 29, 34, 372/38

[56] References Cited

U.S. PATENT DOCUMENTS

| | | | |
|---|---|---|---|
| 3,768,037 | 10/1973 | Migitaka et al. | 332/7.51 |
| 4,558,449 | 12/1985 | Gordon | 372/44 |
| 4,802,182 | 1/1989 | Thornton et al. | 372/50 |
| 5,023,878 | 6/1991 | Berthold et al. | 372/20 |
| 5,136,604 | 8/1992 | Paoli et al. | 372/50 |
| 5,151,915 | 9/1992 | Paoli et al. | 372/50 |

OTHER PUBLICATIONS

Ito et al., "Stationary and Transient Thermal Properties of Semiconductor Laser Diodes", IEEE Journal of Quantum Electronics, vol. QE-17, No. 5, May 1981, pp. 787-795.

Kressel et al., *Semiconductor Lasers and Heterojunction LEDs*, Academic Press, 1977, pp. 573-575.

*Primary Examiner*—James W. Davie
*Attorney, Agent, or Firm*—Jonathan A. Small

[57] ABSTRACT

Modulation-induced thermal crosstalk between the independently addressable lasers of a monolithic multilaser array is reduced or eliminated by forming each laser with two optically coupled active regions, an amplifier region and a modulator region. Modulation of the laser output is achieved by varying the internal optical loss of the modulator region, known as Q-switching. In one form, control of this loss is achieved by varying the reverse bias voltage applied to the modulation region. In another form, control of this loss is achieved by selectively connecting and disconnecting regions of p-type and n-type material in the modulator region together. In a third form, control of this loss is achieved by selectively connecting and disconnecting the modulator region to ground potential. In a fourth form, control of this loss is achieved by increasing the amplifier current to allow lasing and simultaneously offset any thermal effects produced by the increased optical power emitted. Q-switched operation of laser results in a cooling of the laser during operation. Increasing the bias applied to the amplifier region results in heating of the laser during operation. Parameters for Q-switching and biasing the amplifier region are selected such that cooling of the laser attributed to Q-switched operation is approximately equally offset by heating attributed to increasing the bias applied to the amplifier region.

28 Claims, 5 Drawing Sheets

ARRAY AND METHOD OF OPERATING A MODULATED SOLID STATE LASER ARRAY WITH REDUCED THERMAL CROSSTALK

BACKGROUND OF THE INVENTION

The present invention relates to methods of controlling the output of a solid state laser, and more particularly to a method of reducing transient thermal crosstalk in a monolithic array of individually modulated lasers by providing a loss region in each laser whose loss may be modulated by selective application of a voltage, and means for controlling the bias applied to an amplifier region of the laser in conjunction with the application of the voltage to the loss region.

The subject matter disclosed and claimed herein relates to copending U.S. patent application Ser. No. 07/634,989, now U.S. Pat. No. 5,151,915 assigned to the assignee hereof.

Solid state lasers, also referred to as semiconductor lasers or laser diodes, are well known in the art. These devices are based on the p-n junction from semiconductors, and quantum electronics from lasers. The devices generally consist of a layered semiconductor structure having one or more active layers bounded at their ends by cleaved facets which act as mirrors. An optical resonator, or so-called Fabry-Perot cavity is thereby formed. An electrical potential is applied across the one or more active layers. The voltage drives either holes or electrons or both across the p-n junction (i.e., they are "injected"), and when these carriers recombine they emit light. Optical feedback is provided by the cleaved facets to allow "stimulation" of the recombination to provided coherent emission.

This type of laser is employed in communication systems, laser xerography, and other applications where the device's small size, low operating current, and other characteristics are beneficial. A presently active area in research and development for these applications is the integration of a number of solid state lasers or solid state lasers and other devices onto a single substrate. For example, monolithic arrays of independently addressable solid state lasers (referred to herein as "multilaser arrays") are the optical sources of choice for high-speed, high-resolution laser xerographic printers.

In virtually all of the applications of these lasers it is necessary to modulate the output of the laser. Where a number of solid state lasers are integrated onto a single substrate, it is almost always necessary to modulate the output of each laser independently. In some applications this modulation is at a very high frequency, in others it is at a low frequency, and in still others this frequency will vary. Since lasing depends on a current flowing into the active layer, one obvious way to modulate the light output of a laser is to modulate the driving current. In fact, varying the driving current is presently the most common and conventional way in which a laser's output is modulated. However, this method of modulation has a number of distinct drawbacks and disadvantages, among which is transient heating of the chip on which the laser or lasers are formed.

The causes of heating of a laser structure are well reported in the art. For example, see M. Ito and T. Kimura, "Stationary and Transient Thermal Properties of Semiconductor Laser Diodes," IEEE Journ. of Quant. Electronics, vol. QE-17, pp. 787-795, May. 1981. Energy is introduced into the active region, by injecting electrons into the conduction band and/or holes into the valence band. A certain number of electrons fall back down into the valence band through nonradiative processes and release their energy in the form of heat. This may be quantified by first assuming that driving current is modulated between the laser's threshold current, $I_{th}$, and the operating current, $I_0$, at which the operating power $P_0$ is produced. The heat generated by such modulation is then given by $$\Delta Q = [I_0 V_0 - P_0 - P_{sp0}] - [I_{th} V_{th} - P_{spth}], \quad (1)$$

where $V_0$ is the laser voltage at $I_0$, $V_{th}$ is the laser voltage at $I_{th}$, and $P_{sp0}$ and $P_{spth}$ are the spontaneous emission powers at $I_0$ and $I_{th}$, respectively. Since the laser's junction voltage saturates at threshold, $$V_0 = V_{th} + (I_0 - I_{th}) R_s \quad (2)$$

where $R_s$ is the series resistance of the laser. Also, since the spontaneous emission power saturates at threshold, $P_{sp0} = P_{spth}$, so that equation (1) can be rewritten as $$\Delta Q = P_0 [V_{th} + I_0 R_s - \eta]/\eta \quad (3)$$

where $P_0 = \eta (I_0 - I_{th})$.

Figure 1:
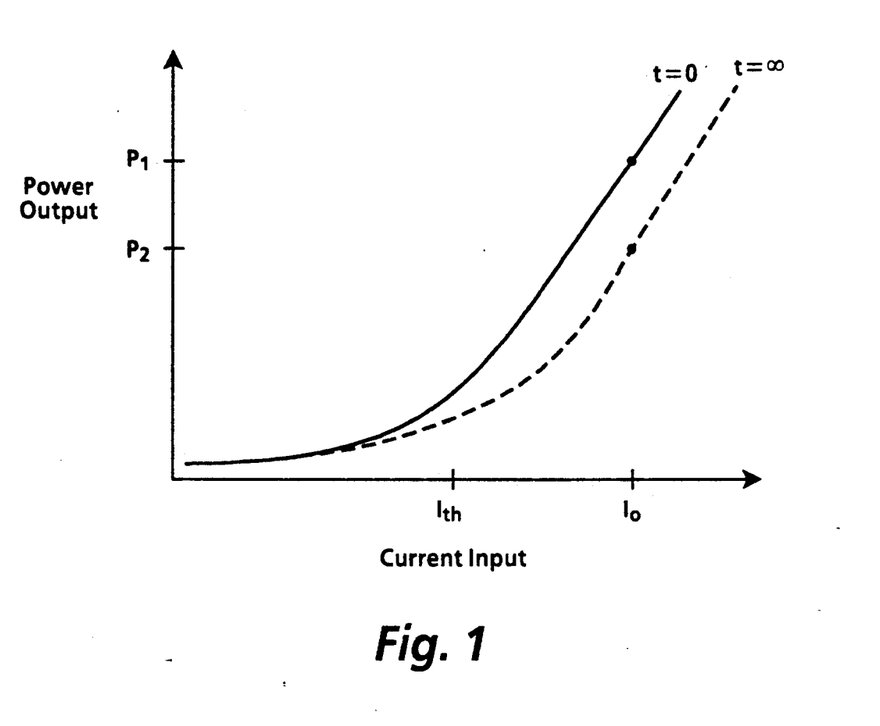
FIG. 1 is a plot of power output versus input current for a solid state laser of the type known in the art, showing the effect of device heating.
Figure 2:
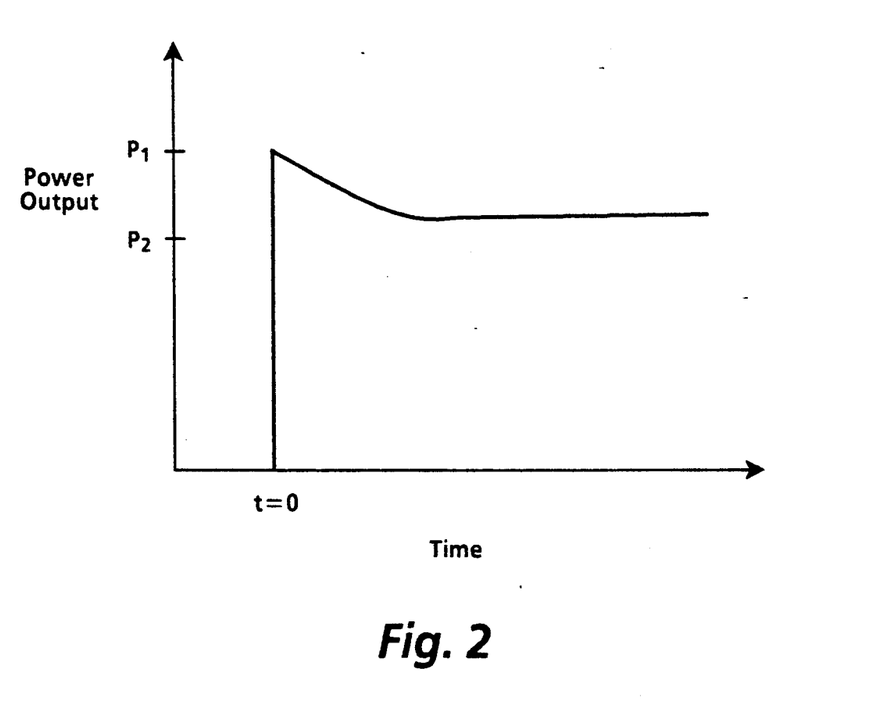
FIG. 2 is a plot of power output versus time for a solid state laser of the type known in the art, showing power output "droop"

Transient heating, or heating which changes in time, results in a number of deleterious effects. For example, since a laser's output power is temperature dependent, temperature variations can result in power output "droop." That is, at the time $t = 0$ that the current applied to the laser reaches $I_0$, the laser will be at a first temperature, and its output power will have a first value, say $P_1$ as shown in FIG. 1. However, as the applied driving current increases beyond threshold to the operating current, the temperature of the laser increases. This increase occurs much more slowly than the time it takes the laser to begin to lase in response to the driving current, so that this temperature change occurs at a constant driving current. This heating results in a shift in the output characteristics of the laser to that shown for the time $t = \infty$ of FIG. 1. This will cause the laser to have an output power $P_2$ which is less than $P_1$, resulting in output power droop. Thus, the plot of output power versus time of FIG. 2 shows an initial power of $P_1$ at turn-on, "drooping" to $P_2$ as the device is operated.

In monolithic multilaser array applications, the thermal variations may lead to emitter crosstalk. That is, when a first laser is modulated the local temperature will vary. Due to the ability and desire to space the individual lasers very close together, this local temperature variation will be transmitted through the chip, causing or accentuating temperature variations in the neighboring lasers on the chip. This renders the power output of the neighboring lasers unpredictable and erratic. Thus, there is a need to minimize the effect modulating one laser may have on the operation of the other lasers.

A related consequence of transient heating of the chip is pattern effects in the output pulse stream. Assume that the laser is modulated at varying frequencies. The time between successive pulses of the laser will then vary. If the time between successive pulses is large, the device will be given sufficient time to cool so that the application of the driving current has a large temperature effect (i.e., a large droop in output power will occur at turn-on). The shorter the time between pulses, the less time the device has to cool between one pulse and the next.

Since the power output determines the output energy profile, the amount of droop will determine the amount of variation in the energy in each pulse, which will in turn have a direct effect on the stability of the laser's output. For example, in laser xerographic applications, varying the energy in each output pulse results in varying exposure of the photoreceptor, which translates directly into varying spot size. Thus, a more constant operating temperature of the device will resulting in a more constant output power, a more uniform output energy profile, and ultimately a more uniform spot pattern for the output pulse stream. Again, where two or more lasers are operated on the same chip, transient thermal cross talk will result and the output pattern will be unpredictable and erratic.

Another related consequence of transient heating of a laser is wavelength variation during a pulse and over long streams of pulses. Essentially, the operating wavelength of a solid state laser is dependent, inter alia, on the temperature of operation. If the temperature varies, the wavelength of operation will vary. The effect of this variation of wavelength, for example in the laser xerography application, is to vary the energy that can be written onto the photoreceptor. This also can translate directly into variations in the spot pattern on the photoreceptor. Thus, in order to maintain the output of the various lasers on the chip at the desired lasing wavelength, it is important to minimize the thermal crosstalk between them.

As relationship (3) demonstrates, the temperature change is, in part, a function of the difference between $I_{th}$ and $I_0$. Methods of operation have been developed, however, which result in smaller differences between $I_{th}$ and $I_0$ than others. Certain of these methods employ a laser structure having two coaxial, independently addressable regions (hereinafter an "amplifier region" and a "modulator region"), each with its own p-n junction, formed between two cleaved facets on a single substrate. Such a structure is described in detail in U.S. Pat. No. 4,802,182, dated Jan. 31, 1989, to Thornton et al., which is incorporated by reference herein. This reference provides several modes of operation. One mode, called the "electro-absorption mode", is one in which the amplifier region is sufficiently forward biased to cause stimulated emission, and a negligible minimal forward bias current is applied to the modulator region as the voltage to the modulator region is varied. In this mode, the modulation is controlled by electro-absorption in the modulation region, wherein as the voltage is increased (from negative to positive), the modulation region becomes more transparent to and less absorbent of the emission from the amplifier region. Another mode, called the "gain modulation mode", also has the amplifier region sufficiently forward biased to cause stimulated emission, but has the DC voltage on the modulator region generally constant while the current is varied. In this mode, modulation of the output will be a result of changes in the emission gain in the modulator region due to the changes in carrier density in that region.

Another structure employing coaxial, independently addressable regions is described in detail in U.S. Pat. No. 5,023,878, dated Jun. 11, 1991, to Berthold, et al. One region of this structure, called a gain region, is sufficiently biased to result in optical gain within the structure while another section, called a loss section, is biased with a varying reverse voltage in order to vary the internal loss of the laser and thereby its net optical gain. Since threshold current varies directly as a function of the net optical loss in the laser cavity, the optical output of the laser is switched between two levels by varying the voltage on the loss region between two levels below one volt.

The modulation of a laser by varying the loss in the modulator region is generically referred to as Q-switching. Another approach to modulating a laser based on Q-switching is discussed in Kressel and Butler, Semiconductor Lasers and Heterojunction LEDs, Academic Press, 1977, p. 574. A two region laser is described therein, in which, as with the above references, the amplifier region is strongly pumped with current to serve as a light emitting region, and the modulator region is pumped with a lower current level than the amplifier region to effect high frequency modulation. The operation described in this reference, however, provides self-sustaining modulation. As described in the reference, when a photon is emitted by the first region and absorbed by the second region an electron-hole pair is formed. A following photon with a sufficiently high energy which enters the second region will cause stimulated emission, which reduces the carrier population in the second region for the next incident photon. Thus, if the device parameters and operating conditions are properly selected, self-sustaining periodic modulation occurs.

Another Q-switched method is described in U.S. Pat. No. 3,768,037, dated Oct. 23, 1973, to Migitaka et al. In the method described therein, a laser is provided having a structure similar to the above-mentioned two-region devices, with one region being defined by either a "U" shaped contact or an "L" shaped contact. An amplifier region is sufficiently biased to result in stimulated emission, and a varying reverse bias is applied to a modulation region such that a depletion region is formed therein. Since threshold current varies directly as a function of the loss in the resonator cavity of the laser, the output of the laser may be modulated by varying the loss which may be accomplished by varying the reverse bias on the modulator region.

Each of these Q-switching schemes requires a laser whose structure includes separate amplifier and modulator regions. This geometry is accepted in single laser applications such as that of the aforementioned references. However, Q-switching has not been employed in arrays of lasers because to do so would require the introduction of a modulator region in the device geometry, which increases the loss of the resonator. This increase in loss results in an increase in the threshold current for the laser. In the commonly employed current modulated lasers this increase in threshold means an increase in operating temperature. Since this implies an increase in the temperature differential between the ON and OFF states of the laser, an increase in threshold is expected to result in an increase in thermal cross talk. Thus, not only have multilaser array applications been unable to avail themselves of Q-switching techniques, there has been great effort made to minimize $I_{th}$.

Furthermore, this desire to keep the temperature difference between the ON and OFF states to a minimum also leads to operating a laser at low power levels, since the higher the output power level is, the higher the input current is, and the greater the difference between $I_{th}$ and $I_0$. This is disadvantageous since it puts great demands on the equipment designed to receive the laser's output.

These and other problems are addressed by various aspects of the present invention, which will be summarized then described in detail below.

SUMMARY OF THE INVENTION

The present invention provides a method of minimizing the thermal crosstalk between lasers of a monolithic laser array wherein each laser includes an optically coupled amplifier region and modulator region, operated in a voltage controlled Q-switching mode to reduce to a negligible level thermal variations within the laser chip during its operation. The amplifier region of each laser provides essentially all of the gain required to produce the desired output intensity. The modulator region controls the output intensity by switching the internal loss of the laser from a high to a low value. The modulator contacts are isolated from all amplifier contacts and from the other modulator contacts. The amplifier and modulator regions may be optically coupled by way of a low loss, two dimensional waveguide, or simply be in sufficient proximity to one another to permit direct optical coupling. The optical beams are extracted from the facet adjacent the modulator region.

To eliminate the thermal variations that inherently accompany modulation of a laser's output by varying its driving current, the present invention modulates the laser output by varying the voltage applied to the modulator region. In addition, the current applied to the amplifier region is varied in conjunction with the variation of the voltage applied to the modulator region. According to this method, the laser operates at a somewhat elevated but constant temperature. Modulating the laser from the non light emitting, or OFF state, to the light emitting, or ON state, by changing a potential across the modulator region results in a slight decrease in operating temperature which may result in cross talk as described above. Also as described above, increasing the current to the amplifier region results in an increase in operating temperature. Thus, by coordinating the application of a potential across the modulator region (cooling) with an increase in the operating current of the amplifier region (heating) the net operating temperature of the laser may be maintained constant, and thermal crosstalk is eliminated.

The invention requires introduction of a loss region during operation of the laser, thus increasing the threshold of the laser, which is contrary to the teachings of the art. However, such an operating scheme provides a number of advantages, including: (1) the temperature of the laser chip remains stable as the output power is fully modulated; (2) the requirements of low threshold, high $T_0$, and low operating current for the laser array are substantially relaxed compared to conventional operation of the laser array, and becomes an even greater advantage for structures such as AlGaInP lasers where thresholds and operating currents are relatively high or very sensitive to temperature variations; and (3) the method of operation and laser array structure are easily implemented and will reduce the manufacturing cost of multilaser arrays by significantly increasing the yield of acceptable lasers and prolonging their system life.

DETAILED DESCRIPTION

Figure 3:
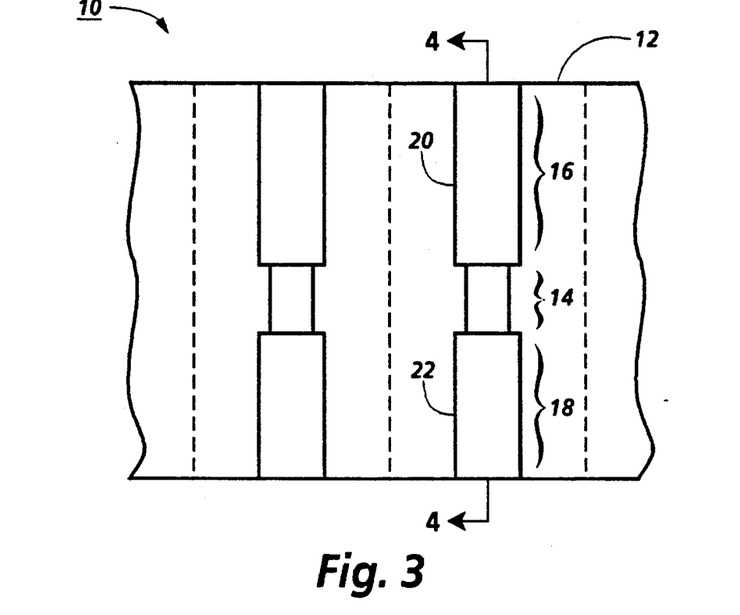
FIG. 3 is a plan view of a portion of a monolithic solid state laser array, showing two elements (lasers) thereof.
Figure 4:
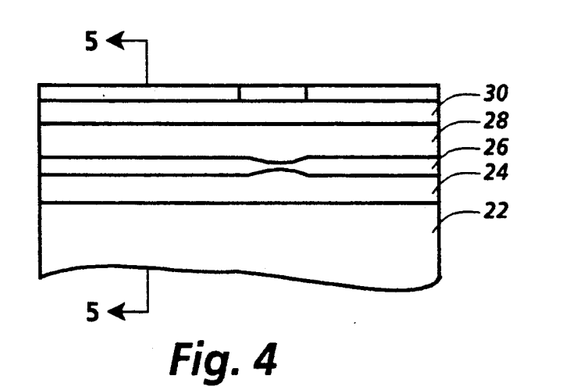
FIG. 4 is a cross sectional view of the monolithic solid state laser array of FIG. 3.
Figure 5:
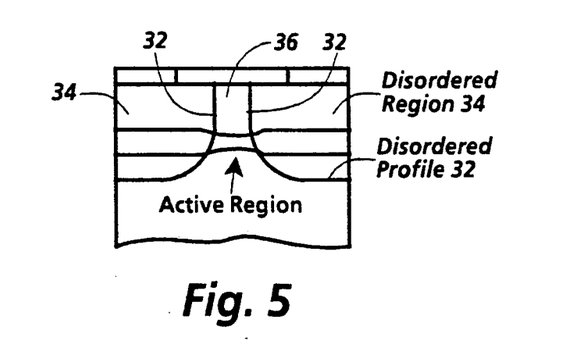
FIG. 5 is a cross sectional view of the monolithic solid state laser array of FIG. 3. looking perpendicular to the cut away of FIG. 4.

In order to provide a foundation upon which a description of the present invention may be based, the structure of a laser array operable according to the present invention will initially be discussed, with particular attention to one arbitrary laser 12 of the array of lasers shown at 10 of FIGS. 3 through 5. It will be understood, however, that the description of the particular laser structure is illustrative of the operable environment of the present invention, and that the scope of the present invention encompasses operation with a wide variety of laser structures.

An array 10 consists of at least two adjacent laser structures 12, the outputs of which are independently controllable. Laser 12 is a semiconductor heterostructure device which may have its active region defined by impurity induced disordering, of the type described in detail in the aforementioned incorporated patent of Thornton et al. The structure may or may not be a multiple quantum well device as the particular application of the laser will dictate. Laser 12 generally includes a passive waveguide region 14 connecting two active regions which shall be designated as amplifier region 16 and modulator region 18, respectively. The amplifier and modulator regions are formed beneath active region contacts, the amplifier region contact 20 and the modulator region contact 22, respectively. The amplifier region provides essentially all of the gain required to produce the desired output intensity. The modulator region controls the output of laser 12 by switching the internal loss from a high value to a low value. In the event that no passive waveguide 14 is provided between the amplifier and modulator regions, the regions would be formed in sufficient proximity to one another so as to allow direct optical coupling between them. In such a case, diffusion through the active layer and/or proton bombardment may be useful to provide electrical isolation as well known in the art. The optical beams are extracted from the facet adjacent the modulator region in order to minimize the spontaneous emission in the OFF state.

Laser 12 may include a substrate 22, which may be comprised of n-GaAs, on which are consecutively deposited in an MOCVD reactor epitaxial layers 24–30 as known in the art. These epitaxial layers may be, for example: cladding layer 24 of n-Ga$_{1-y}$Al$_y$As, wherein, for example, y≈0.47; active region 26 comprising a layer of Ga$_{1-x}$Al$_x$As where y>x, for example x≈0.05, of a thickness of approximately 105 nm, or alternatively a single quantum well layer of GaAs or a multiple quantum well of alternating layers of GaAs and Ga$_{1-x}$Al$_x$As or alternating layers of Ga$_{1-x}$Al$_x$As and Ga$_{1-z}$Al$_z$As where y>z>x; and cladding layer 28 of p-Ga$_{1-y}$Al$_y$As, as above, where y≈0.47 for example. Where appropriate, a cap layer 30 of p+GaAs may be deposited on the cladding layer 28. Through the use of masking, an impurity source (not shown), for example As doped Si, is formed on portions of either cladding layer 28, or where a cap layer 30 is deposited, on that cap layer. Upon annealing, impurities from this impurity source are driven into the layers below, thus forming a selected disordered profile, for example whose outline is shown at 32 in FIG. 3, where regions 34 are selectively disordered regions and regions 36 are not disordered regions. The cross sectional illustration of the structure shown in FIG. 3 is equally applicable to either the amplifier region 16 or the modulator region 18.

A plurality of such laser structures 12 are formed monolithically to form the array 10. Each laser 12 may have identical dimensions and composition, or one or more of the lasers 12 may be customized to suit particular needs. For example, in U.S. Pat. Ser. No. 4,831,629 to Paoli et al. there is disclosed a monolithic array of lasers having nonuniformities in the geometries of one or more of the various regions in order to uncouple the lasers and render incoherent their respective outputs, which may be employed in conjunction with the present invention.

Modulation of the output intensity is obtained by varying the voltage on the modulator section, for example between 0 and 3 volts, while maintaining a current, for example of 1.0 mA or less. This may be divided into three alternate operating conditions—tying the p and n contacts of the modulator region together, forward biasing and reverse biasing the modulator region. In addition, as the laser is modulated from its OFF state to its ON state by varying the voltage applied to the modulator section, the current applied to the amplifier region is increased. This increase raises the operating temperature of the amplifier region so as to offset the temperature decrease resulting from the increased emission of optical power. By appropriately controlling the operating parameters of the laser, the net operating temperature may be made to remain constant.

Figure 7:
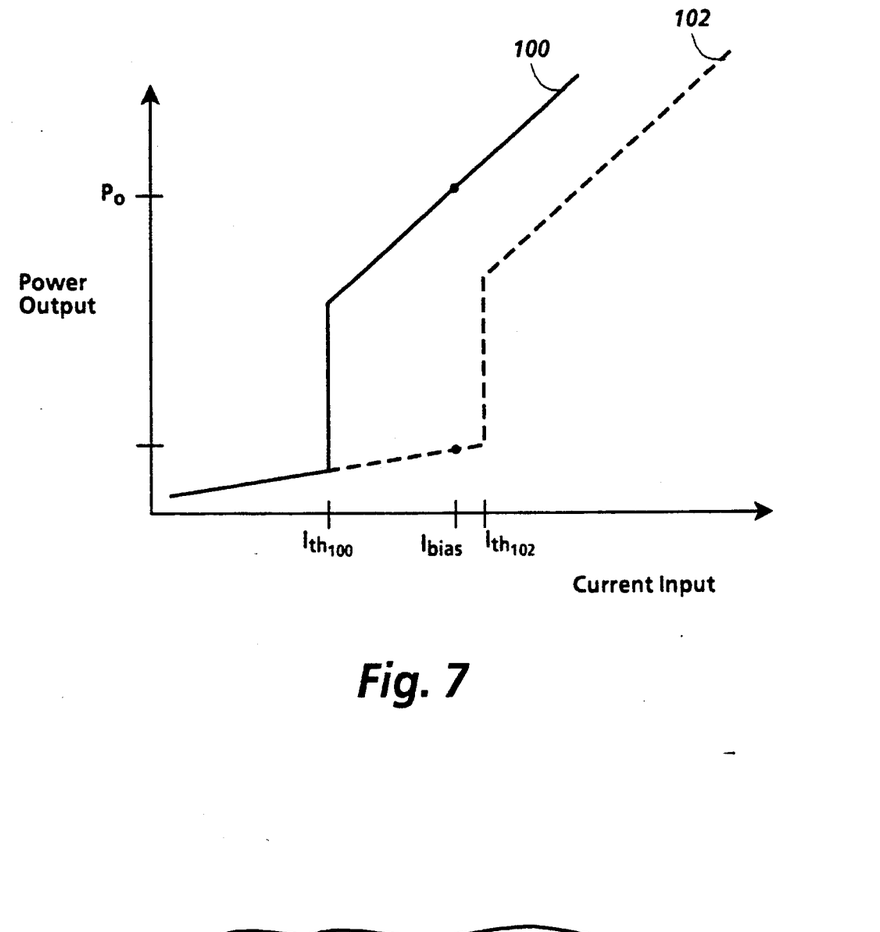
FIG. 7 is a plot of power output versus input current for a solid state laser of the type disclosed herein.

Referring now to FIG. 7, a plot of power output versus current input is shown for a laser such as laser 12 wherein the modulator region is in a low loss condition in curve 100 and in a high loss condition in curve 102. Gain in any laser is based on the fact that a first photon incident on a carrier residing in the conduction band will cause the carrier to fall into the valence band and emit a second photon without absorbing the first photon. Loss in the modulator region is based on the idea that there is a large population of carriers in the valence band as opposed to the conduction band in that region. A photon whose energy is above the bandgap which is incident upon a carrier in the valence band will be absorbed by that carrier, and thereby move into the conduction band. If a sufficient number of photons enter the modulator region, a large percentage of the carriers in the region will be moved into the conduction band and the optical loss begins to decrease. This is shown by the increase in power output for current input of the regions below the threshold currents I$_{th100}$ and I$_{th102}$ for curves 100 and 102, respectively. Increasing the number of photons entering the modulator region to a high enough value will result in saturation of the loss, wherein photons entering the region encounter a high concentration of carriers in the conduction band. This triggers gain in the region, which increase the number of photons and further reduces the population of carriers in the valence band, further reducing the loss. This is the threshold region shown by the sharp jump taken by curves 100 and 102, which correspond respectively to the threshold currents I$_{th100}$ and I$_{th102}$. Increases in the number of photons beyond the saturation point result in a complete "bleaching out" of the loss in the modulator region, which is the condition at the regions beyond the threshold currents I$_{th100}$ and I$_{th102}$. If, however, an alternate path is provided for the carriers to return to the valence band, other than when photons are incident thereupon, the gain in the region is reduced. If a sufficient number of the carriers are returned to the valence band via this alternate path, the loss of the region may increase to the point that lasing may be inhibited. According to the present invention, this alternate path may be provided by electrically connecting the p and n contacts of the modulator region 18 together. By switchably connecting the p and n contacts of the modulator region 18, the loss of the region, and hence the output of the laser may be modulated.

Figure 6:
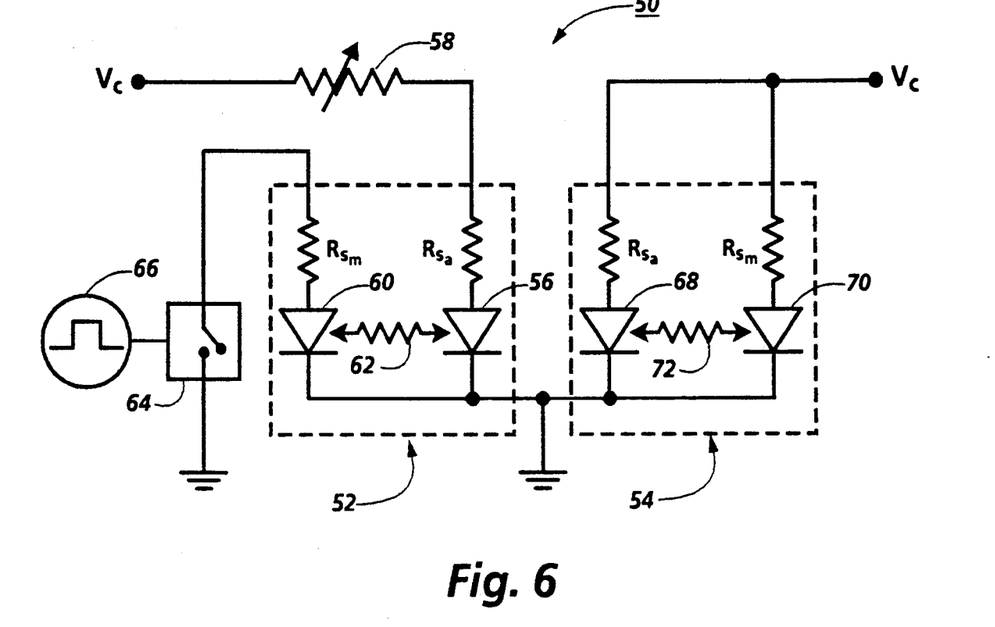
FIG. 6 is a schematic representation of a two element monolithic solid state laser array set up for testing the effect of modulation of one laser on the output of the second laser.
Figure 6A:
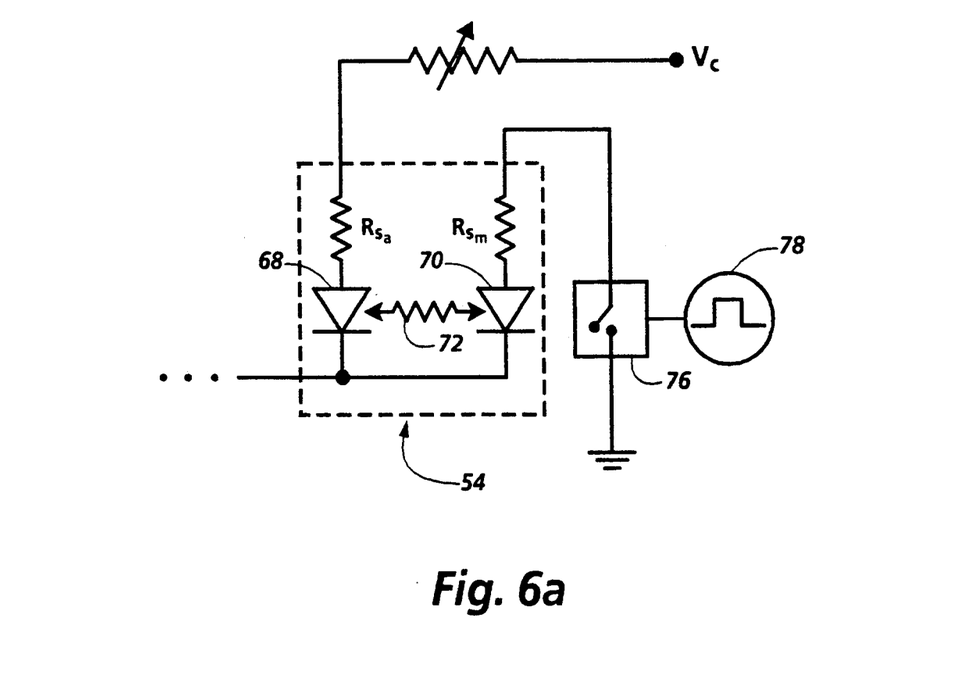
FIG. 6a is a partial schematic representation of a two element monolithic solid state laser array which, when taken together with FIG. 6, show a set up for independent modulation of each of the lasers.

Referring to FIG. 6, there is shown therein a two element multilaser array device 50 set up for evaluating the effects of modulation of one of its lasers 52 on the output of its second laser 54. Amplifier region 56 of the first laser 52 is connected to a direct voltage source V$_C$ via rheostat 58 such that at a minimum a sufficient constant bias may be applied to bring about lasing with switching element 64 in its open position, and further such that as desired the bias may be raised above the minimum with appropriate circuitry as schematically illustrated by rheostat 58. A portion of this stimulated emission is emitted coaxially with the modulator region 60 of first laser 52. This emission will be guided by a waveguide which will introduce some loss, which is represented for illustration purposes by resistance 62. Modulator region 60 will be connected to ground potential via a switching element 64 which will be driven by a controller 66 at a predetermined frequency. The amplifier region 68 and modulator region 70 of second laser 54 will be similarly optically coupled by a low loss waveguide 72 as that described above for first laser 52. Both the amplifier region 68 and the modulator region 70, for evaluation purposes, are biased by a continuous voltage source V$_C$, such that stimulated emission occurs in both amplifier region 68 and modulator region 70. The output of second laser 54 can then be observed while the first laser 52 is modulated. Operation of the two lasers 52 and 54 as independently addressable optical sources may be achieved by modulating second laser 54 in a manner similar to that of first laser 52, as shown in FIG. 6a, where, as with all figures herein, like reference numerals denote like elements.

It is possible that the operating conditions and output power of the amplifier region will be such that the switchable connection to ground will not provide a sufficient channeling of the carriers to inhibit lasing. In such a case, the modulator region may be reverse biased to supplement the removal of carriers from the conduction band. Determination of the need for, and level of reverse biasing of the modulator region will depend not only on the biasing of the amplifier region, but also on the geometry (i.e., comparative lengths) of the amplifier and modulator regions. For example, as the length of the amplifier increases relative to the length of the modulator, threshold current $I_{th102}$ decreases, becoming less than or equal to $I_{bias}$ in FIG. 7 which prevents Q-switched operation. In this case, reverse bias of the modulator will maintain $I_{th102}$ above $I_{bias}$ and allow Q-switched operation at the desired output power.

Due to the presence of a p-n junction in the modulator region 18 (FIG. 3), there exists an electric field across this region, even at zero bias. As a forward bias is applied to the p-n junction, the magnitude of this electric field is decreased, thereby shifting the absorption band edge to a higher energy (shorter wavelength), reducing the magnitude of the absorption at the wavelength of maximum gain in the amplifier region. Thus a decrease in lasing threshold is observed as the positive applied voltage bias is increased. When the applied positive voltage attains a value approximately equal to the bandgap energy, electrons are injected into the conduction band and holes into the valence band, producing a further decrease in the optical loss as a current flows in the modulator region. Further increases in this current will cause the optical loss to approach zero, beyond which further increases in current produce optical gain.

By varying the reverse voltage applied to the modulator region, the output curve is shifted from that shown at 100 of FIG. 7 to that shown at 102. It will now be appreciated that the laser's output may be fully modulated while keeping the current to the amplifier region constant at $I_{bias}$. Control of the laser's output by modulating the voltage on the modulator region, whether in forward or reverse bias modes, may be obtained under proper conditions for a selected geometry with a minimal amount of current. If the current were to be varied in a single contact laser in order to achieve this modulation, it would be necessary to vary the current between $I_{th}$ and $I_0$ in FIG. 1, which may be on the order of 10 or more mA. This becomes prohibitive when a laser requiring a bias current of 40-50 mA or more is operated at a very high output power. In such a case, the thermal transients from varying the current between $I_{th}$ and $I_0$, would generate unmanageable and detrimental thermal crosstalk.

Quantification of the transient heat generation in the case of a basic split contact device operated in the Q-switched format differs from that presented in equations (1) through (3) above, in that now $I_{th}=I_0$. That is, the driving current remains constant at $I_0$ while the light intensity is modulated by switching between the two curves shown in FIG. 7. The heat input for this modulation format is given by $$\Delta Q = [I_0 V_l - P_0 - P_{spth}] - [I_0 V_{nl} - P_{sp0}] \quad (4)$$
$$= I_0(V_l - V_{nl}) - P_0 - P_{spth} + P_{sp0}$$

where $V_l$ is the voltage at $I_0$ with lasing and $V_{nl}$ is the voltage at $I_0$ with no lasing.

Since $P_{sp0} - P_{spth}$ is much less than $P_0$, this equation reduces to $$\Delta Q = -[P_0 + I_0(V_{nl} - V_l)] \quad (5).$$

However, since $(V_{nl} - V_l)$ is at most a few mV, $I_0(V_{nl} - V_l)$ is only 0.1 to 0.2 mW for operating currents as high as 50 mA, and hence $$\Delta Q \approx -P_0 \quad (6).$$

Thus, the dominant heat input in Q-switched operation is expected to be the negative of the emitted optical power. The negative sign means that the chip is cooled when the optical power is switched on. Cooling due to Q-switched modulation was confirmed experimentally in the operation of the devices discussed in the above referenced copending U.S. patent application Ser. No. 07/634,989, where the cross talk was observed to be in phase with the light modulation for the Q-switched device. Heating due to current modulation was confirmed in the operation of the single contact laser as discussed in the above referenced application, where the crosstalk was observed to be out of phase with the light modulation.

Figure 8:
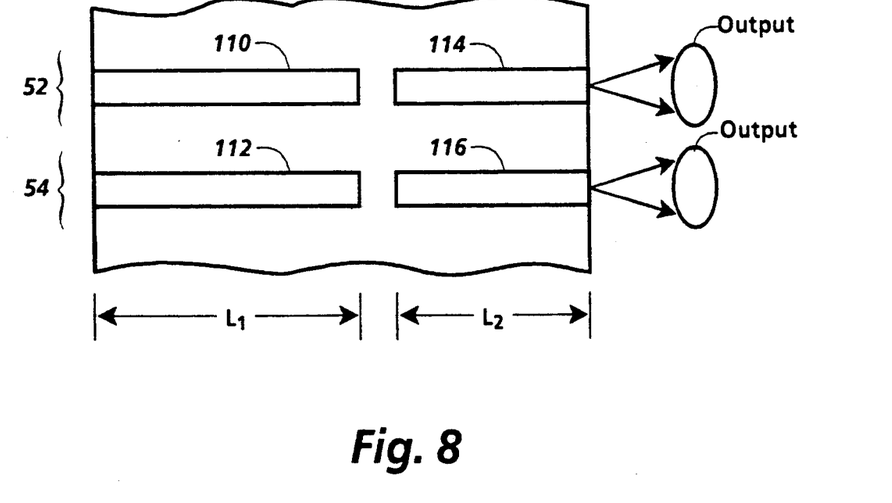
FIG. 8 is a plan view of a two element monolithic solid state laser array such as that yielding the output of FIG. 7.

Specifically, the split contact dual laser chip of FIG. 8 operated as a conventional single contact laser is a low efficiency, high threshold laser. The measured parameters for a typical device were $I_{th}=27.0$ mA, $V_{th}=1.730$ volts, $I_0=49.4$ mA, $R_S=2.62$ ohms, and $\eta=0.40$ mW/mA. Substituting these values into equation (3), $\Delta Q = 3.67 P_0$. When operated in the Q-switched mode, equation 5 gives $\Delta Q \approx -P_0$ since $I_0(V_{nl}-V_l)=54.7$ mA $\times$ 2 mV = 0.11 mW, which is negligible compared to $P_0=8$ mW. Thus, Q-switching has been shown to produce 3 to 4 times less transient heat than operation with a single contact in a current modulated format. This reduced heat produces less thermal crosstalk between the emitters. For example, the crosstalk for the Q-switched modulation of laser 52 shown in FIG. 8 has been determined in the above referenced copending U.S. patent application Ser. No. 07/634,989 as $$\text{fractional crosstalk} = \frac{\text{amplitude of modulation in output power of laser 54}}{\text{average output power emitted by laser 54}}$$
$$= (1.7 \times 20 \text{ mV})/(4.8 \times 500 \text{ mV}) = .014$$

or 1.4%, and the leakage determined as $$\text{fractional leakage} = \frac{\text{amplitude of measured signal with laser 54 turned off}}{\text{average output power emitted by laser 54 when turned on}}$$
$$= (0.3 \times 5 \text{ mV})/(4.8 \times 500 \text{ mV}) = .0006$$

or 0.06%, so that, since the leakage is in phase with the crosstalk, the net crosstalk is 1.4% − 0.06% = 1.34%.

Whereas for laser 52 operated as a single contact device in a current modulation format, the crosstalk has been determined in the above referenced copending U.S. patent application Ser. No. 07/634,989 as $$\text{fractional crosstalk} = \frac{\text{amplitude of modulation in output power of laser 54}}{\text{average output power emitted by laser 54}}$$

$$= (1.8 \times 50 \text{ mV})/(4.8 \times 500 \text{ mV}) = .0375,$$
$$\text{or } 3.75\%,$$

and the leakage determined as $$\text{fractional leakage} = \frac{\text{amplitude of measured signal with laser 54 turned off}}{\text{average output power emitted by laser 54 when turned on}}$$

$$= (0.3 \times 5 \text{ mV})/(4.8 \times 500 \text{ mV}) = .0006,$$
$$\text{or } .06\%,$$

so that, since the leakage is out of phase with the crosstalk, the net crosstalk is $3.75\% + 0.06\% = 3.81\%$.

Thus, a number of advantages may be appreciated from operating the lasers of a monolithic laser array in the Q-switched format according to the above, including the improved isolation of the respective lasers from the thermal effects of modulation of the neighboring lasers, and the actual cooling effect which can then be realized, leading to improved control over output amplitude, wavelength, etc. of the lasers. This cooling effect is demonstrated by the negative value obtained by equation (6). In a manner similar to that of an increase in operating temperature of one laser in a laser array, a decrease in operating temperature will also have an effect on the operating conditions of neighboring lasers. To compensate for the cooling effects of the laser operated according to the above description, the operating current applied to amplifier region 20 of laser 12 (FIG. 3) is increased as the absolute value of the reverse voltage applied to modulator region 22 of laser 12 is decreased. This generates heat in the laser according to equation 3, above.

We can analyze the Q-switched modulation as follows: Define $\Delta Q_{curr}$ as the heat generated by incrementing current from a first current $I_0$ to a second current $I_1$ with the laser ON, i.e. with switch 64 open. Then, $$\Delta Q_{curr} = I_1[V_0 + (I_1 - I_0)R_S] - I_0 V_0 \tag{7}$$

where $V_0$ is the voltage at $I_0$. Define $I_1 = \Delta I + I_0$ and insert in equation (7) to get $$\begin{aligned}
\Delta Q_{curr} &= I_1[V_{th} + (\Delta I + \Delta I_0)R_s] - I_0[V_{th} + (\Delta I_0)R_s] \\
&= \Delta I V_{th} + I_1(\Delta I + \Delta I_0)R_s - I_0(\Delta I_0)R_s \\
&= \Delta I V_{th} + I_1(\Delta I)R_s + \Delta I \Delta I_0 R_s = \\
&\quad \Delta I V_{th} + (\Delta I + I_0)(\Delta I)R_s + \Delta I \Delta I_0 R_s \\
&= (\Delta I)^2 R_s + (\Delta I)[V_0 + I_0 R_s]
\end{aligned} \tag{8}$$

Figure 9:
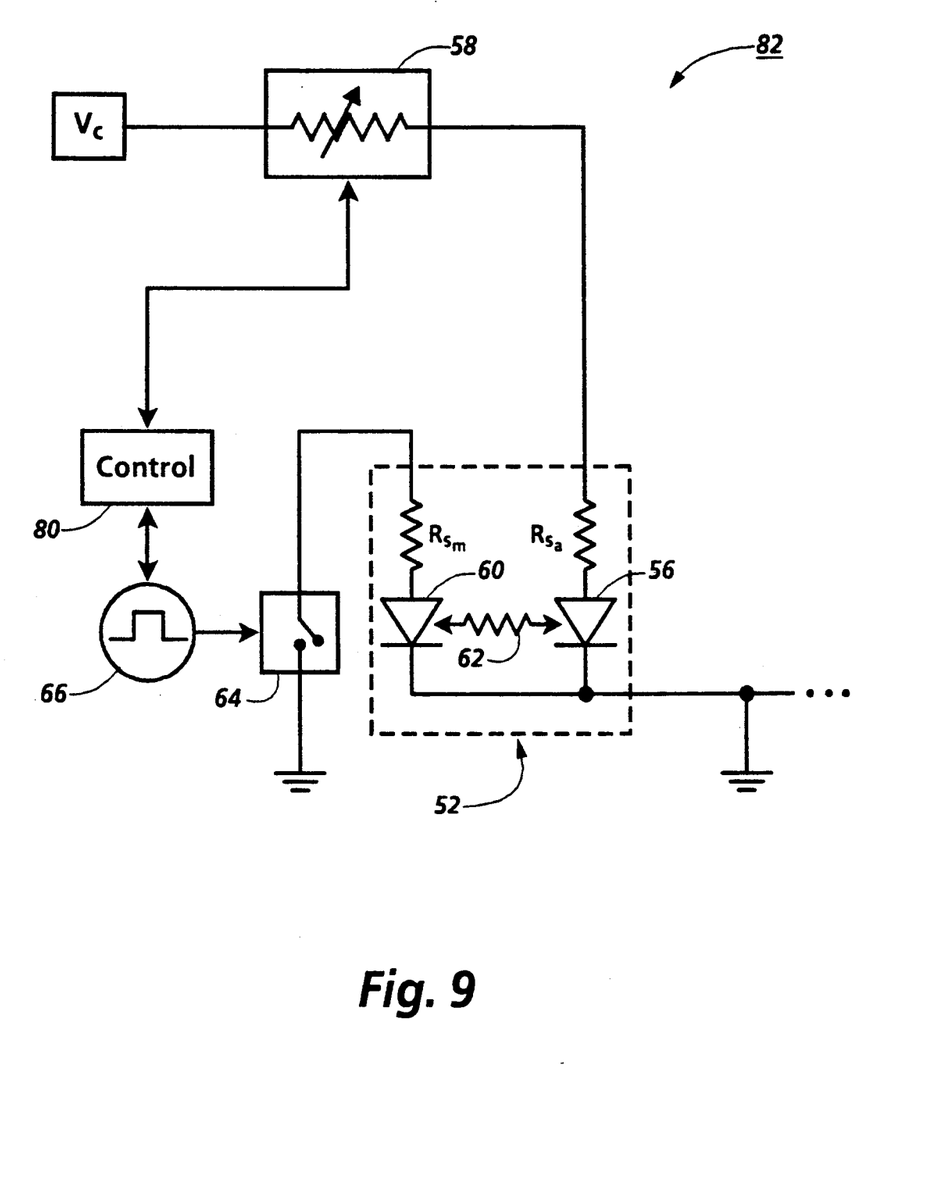
FIG. 9 is a schematic illustration of a device including means for coordinating the application of the voltage to the modulator region with the variation of the current to the amplifier region according to the present invention.

Since we want this heat to balance the cooling of the light, we set $$(\Delta I)^2 R_S + (\Delta I)[V_0 + I_0 R_S] - P_0 = 0 \tag{9}$$

and solve the quadratic for $\Delta I$. The solution is approximately $\Delta I = P_0/b$, where $b = V_0 + I_0 R_S$ since $4R_S P_0/b^2 \ll 1$. Thus, if we know $I_0$, $R_S$, $\Delta I_0$, and $V_0$ we can find $\Delta I$ for a given $P_0$. For the amplifier operated with Q-switched modulation, $I_0 = 54.7$ mA, $R_S = 4.41$ ohms, $I_{th} = 16.0$ mA, and $V_0 = V_{th} + (I_0 - I_{th})R_S = 1.73$ volts $+ 38.7$ mA $\times 4.41$ ohms $= 1.90$ volts. This gives $\Delta I = P_0/1.90$ volts $= 4.21$ mA for $P_0 = 8$ mW. Therefore, if I is incremented 4.21 mA above $I_0$ the net thermal crosstalk is zero. Accordingly, it is possible to coordinate the application of the voltage to the modulator region with the variation of the current to the amplifier region. Control means 80, including for example the detector means detailed in copending U.S. patent application Ser. No. 07/500,814, now U.S. Pat. No. 5,136,604, which is incorporated herein by reference, in an apparatus 82 would serve this function, as generally illustrated in FIG. 9.

In another embodiment of the present invention, switching element 64 is held open, and amplifier region 56 is biased at $I_{bias} > I_{th102} - \Delta I$, where $\Delta I$ is chosen to compensate for the cooling of the laser emission as described above. The laser is then switched to its ON state by modulating the current applied to amplifier region 56 from $I_{bias}$ to $I_{bias} + \Delta I$ where $I_{th102} > I_{bias} > I_{th102} - \Delta I$. $\Delta I$ is chosen to have a magnitude that generates heat sufficient to balance the cooling of the emitted lasing light. The operating current is chosen such that the laser emits the desired optical power $P_0$ at $I_{bias} + \Delta I$.

In conclusion, the scheme shown in FIGS. 6 and 6a for modulating the output of the lasers is advantageous because it requires only a low voltage switching signal, thereby eliminating the need for voltage or current modulation drive electronics, and produces a zero net thermal crosstalk. However, many other control schemes may be realized consistent with the present invention for Q-switching, such as integration of a circuit for voltage modulation of the modulator region. Also, a transistor or diode could be placed in place of switch 66 (or 76) and integrated on the chip with the lasers. In general, to those skilled in the art to which this invention relates, many changes in construction and widely differing embodiments and applications of the present invention will suggest themselves without departing from its spirit and scope. Thus, the disclosures and descriptions herein are illustrative, and are not intended to be in any sense limiting.

I claim:

1. A method of operating an array of monolithically formed independently addressable semiconductor lasers of the type including a plurality of semiconductor layers on a semiconductor substrate, at least one of said layers comprising an active layer divided into a plurality of regions including at least a light amplifying region and a modulator region, comprising the steps of:

applying a sufficient forward bias to the amplifier region such that stimulated emission is caused to occur therein;

directing a portion of said stimulated emission into said modulator region;

varying the internal loss of the modulator region by varying the voltage applied to the modulator region such that at a first voltage the stimulated emission is prevented from causing lasing within the laser, and at a second voltage the stimulated emission is allowed to cause lasing within the laser; and varying the forward bias applied to the amplifier region such that any heat loss or gain due to varying the voltage applied to the modulator region is approximately equally offset by a heat gain or loss due to varying the bias applied to the amplifier region.

2. The method of claim 1 wherein the forward bias on the amplifier region is a direct current.

3. The method of claim 1 wherein the voltage applied to the modulator region is a reverse bias of constant current.

4. The method of claim 3 wherein the voltage applied to the modulator region is between 1 and 3 volts, and the current applied to the modulator region is less than 1.0 mA.

5. A method of operating an array of monolithically formed independently addressable semiconductor lasers of the type including a plurality of semiconductor layers on a semiconductor substrate, at least one of said layers comprising an active layer divided into a plurality of regions including at least a light amplifying region and a modulator region, comprising the steps of:

applying a sufficient forward bias to the amplifier region such that stimulated emission is caused to occur therein;

directing a portion of said stimulated emission into said modulator region;

varying the internal loss of the modulator region by selectively applying a voltage to the modulator region such that when said voltage is applied to the modulator region, the stimulated emission is prevented from causing lasing within the laser, and when said voltage is not applied to the modulator region, the stimulated emission is allowed to cause causing lasing within the laser; and varying the forward bias applied to the amplifier region such that any heat loss or gain due to applying or not applying the voltage to the modulator region is approximately equally offset by a heat gain or loss due to varying the bias applied to the amplifier region.

6. The method of claim 5 wherein the forward bias on the amplifier region is a direct current.

7. The method of claim 5 wherein the voltage applied to the modulator region is a reverse bias of constant current.

8. The method of claim 7 wherein the voltage applied to the modulator region is between 1 and 3 volts, and the current applied to the modulator region is less than 1.0 mA.

9. A method of operating an array of monolithically formed independently addressable semiconductor lasers of the type including a plurality of semiconductor layers on a semiconductor substrate, at least one of said layers comprising an active layer divided into a plurality of regions including at least a light amplifying region and a modulator region, comprising the steps of:

applying a sufficient forward bias to the amplifier region such that stimulated emission is caused to occur therein;

directing a portion of said stimulated emission into said modulator region;

varying the internal loss of the modulator region by selectively connecting and disconnecting the modulator region to ground potential such that when the modulator region is disconnected from ground potential stimulated emission is allowed to cause lasing within the laser, and when the modulator region is connected to ground potential the stimulated emission is prevented from causing lasing within the laser; and varying the forward bias applied to the amplifier region such that any heat loss or gain due to selectively connecting and disconnecting the modulator region to ground potential is approximately equally offset by a heat gain or loss due to varying the bias applied to the amplifier region.

10. The method of claim 9 wherein the forward bias on the amplifier region is a direct current.

11. A method of operating an array of monolithically formed independently addressable semiconductor lasers of the type including a plurality of semiconductor layers on a semiconductor substrate, at least one of said layers comprising an active layer divided into a plurality of regions including at least a light amplifying region and a modulator region, each region having associated with it at least one junction between p-type material and n-type material, comprising the steps of:

applying a sufficient forward bias to the amplifier region such that stimulated emission is caused to occur therein;

directing a portion of said stimulated emission into said modulator region;

varying the internal loss of the modulator region by selectively electrically connecting and disconnecting the p-type material and the n-type material of the modulator region such that when the p-type material and the n-type material are electrically disconnected stimulated emission is allowed to cause lasing within the laser, and when the p-type material and the n-type material are electrically connected the stimulated emission is prevented from causing lasing within the laser; and varying the forward bias applied to the amplifier region such that any heat loss or gain due to selectively connecting and disconnecting the p-type material and the n-type material of the modulator region is approximately equally offset by a heat gain or loss due to varying the bias applied to the amplifier region.

12. The method of claim 11 wherein the forward bias on the amplifier region is a direct current.

13. A method of operating an array of monolithically formed independently addressable semiconductor lasers of the type including a plurality of semiconductor layers on a semiconductor substrate, at least one of said layers comprising an active layer divided into a plurality of regions including at least a light amplifying region and a modulator region, each region having associated with it at least one junction between p-type material and n-type material, comprising the steps of:

applying a sufficient forward bias to the amplifier region such that stimulated emission is caused to occur therein;

directing a portion of said stimulated emission into said modulator region such that the optical output of each semiconductor laser exhibits an abrupt increase with forward bias applied to the amplifier; and varying the forward bias applied to the amplifier region such that the stimulated emission is allowed to cause lasing within the laser and any temperature change of the laser due to the lasing is approximately equally offset by a temperature change due to varying the bias applied to the amplifier region.

14. The method of claim 13 wherein the forward bias on the amplifier region is a direct current.

15. A light emitting device, comprising
an array of monolithically formed independently addressable semiconductor lasers, comprising:
a semiconductor substrate;

a plurality of semiconductor layers formed on said substrate such that at least one of said layers forms an active layer of narrower bandgap than layers adjacent thereto;

a first active region formed in said active layer for each laser, including a two dimensional optical cavity for functioning as a laser; and a second active region formed in said active layer of at least one of the lasers of the array, including a two dimensional optical cavity coaxial with said optical cavity of said first active region for functioning as an optical modulator; and means for independently applying a variable bias across each of said first and second active regions;

wherein a sufficient forward bias is applied to said first active region of at least one of the lasers of the array such that stimulated emission is caused to occur therein, a portion of said stimulated emission being directed into said second active region of said at least one laser, the internal loss of the second active region of said at least one laser is varied by varying the voltage applied to said second active region such that at a first voltage the stimulated emission is prevented from causing lasing within said at least one laser, and at a second voltage the stimulated emission is allowed to cause lasing within said at least one laser, and the forward bias applied to the first active region is varied such that any heat loss or gain due to varying the voltage applied to the second active region is approximately equally offset by a heat gain or loss due to varying the bias applied to the first active region.

16. The light emitting device of claim 15 wherein the forward bias on said first active region is a direct current.

17. The light emitting device of claim 15 wherein the voltage applied to said second active region is reverse biased at a constant current.

18. The light emitting device of claim 17 wherein the voltage applied to said second active region is between 1 and 3 volts, and the current applied to said second active region is less than 1.0 mA.

19. A light emitting device, comprising:

an array of monolithically formed independently addressable semiconductor lasers, comprising:

a semiconductor substrate;

a plurality of semiconductor layers formed on said substrate such that at least one of said layers forms an active layer of narrower bandgap than layers adjacent thereto;

a first active region formed in said active layer for each laser, including a two dimensional optical cavity for functioning as a laser;

a second active region formed in said active layer of at least one of the lasers of the array, including a two dimensional optical cavity coaxial with said optical cavity of said first active region for functioning as an optical modulator;

means for applying a variable bias across said first active regions; and means for selectively applying a bias across said second active region;

wherein a sufficient forward bias is applied to said first active region of at least one of the lasers of the array such that stimulated emission is caused to occur therein, a portion of said stimulated emission being directed into said second active region of said at least one laser, and the internal loss of the second active region of said at least one laser is varied by selectively applying the voltage to said second active region such that when said voltage is applied to said second active region the stimulated emission is prevented from causing lasing within said at least one laser, and when said voltage is not applied to said second active region the stimulated emission is allowed to cause lasing within said at least one laser, and the forward bias applied to the amplifier region is varied such that any heat loss or gain due to selectively applying the voltage to the second active region is approximately equally offset by a heat gain or loss due to varying the bias applied to the first active region.

20. The light emitting device of claim 19 wherein the forward bias on said first active region is a direct current.

21. The light emitting device of claim 19 wherein the voltage applied to said second active region is reverse biased at a constant current.

22. The light emitting device of claim 21 wherein the voltage applied to said second active region is between 1 and 3 volts, and the current applied to said second active region is less than 1.0 mA.

23. A light emitting device, comprising:

an array of monolithically formed independently addressable semiconductor lasers, comprising:

a semiconductor substrate;

a plurality of semiconductor layers formed on said substrate such that at least one of said layers forms an active layer of narrower bandgap than layers adjacent thereto;

a first active region formed in said active layer for each laser, including at least one junction between p-type and n-type material, and further including a two dimensional optical cavity for functioning as a laser; and a second active region formed in said active layer of at least one of the lasers of the array, including at least one junction between p-type and n-type material, and further including a two dimensional optical cavity coaxial with said optical cavity of said first active region for functioning as an optical modulator;

means for applying a variable bias across said first active regions; and means for selectively electrically connecting and disconnecting the p-type material and the n-type material of said second active region;

wherein a sufficient forward bias is applied to said first active region of at least one of the lasers of the array such that stimulated emission is caused to occur therein, a portion of said stimulated emission being directed into said second active region of said at least one laser, and the internal loss of the second active region of said at least one laser is varied by selectively electrically connecting and disconnecting the p-type material and the n-type material of said second active region such that when said p-type material and n-type material are electrically disconnected, stimulated emission is allowed to cause lasing within said at least one laser, and when said p-type and n-type material are electrically connected the stimulated emission is prevented from causing lasing within said at least one laser, and the forward bias applied to the first active region is varied such that any heat loss or gain due to selectively electrically connecting and disconnecting the p-type material and the n-type material of the second active region is approximately equally offset by a heat gain or loss due to varying the bias applied to the first active region.

24. The array of claim 23 wherein the forward bias on said second active region is a direct current.

25. A light emitting device, comprising
an array of monolithically formed independently addressable semiconductor lasers, comprising:
  a semiconductor substrate;
  a plurality of semiconductor layers formed on said substrate such that at least one of said layers forms an active layer of narrower bandgap than layers adjacent thereto;
  a first active region formed in said active layer for each laser, including a two dimensional optical cavity for functioning as a laser; and
  a second active region formed in said active layer of at least one of the lasers of the array, including a two dimensional optical cavity coaxial with said optical cavity of said first active region for functioning as an optical modulator;
means for applying a variable bias across said first active regions; and
means for selectively electrically connecting and disconnecting said second active region to ground potential;
wherein a sufficient forward bias is applied to said first active region of at least one of the lasers of the array such that stimulated emission is caused to occur therein, a portion of said stimulated emission being directed into said second active region of said at least one laser, and the internal loss of the second active region of said at least one laser is varied by selectively connecting and disconnecting said second active region to ground potential such that when said second active region is disconnected from ground potential stimulated emission is allowed to cause lasing within said at least one laser, and when said second active region is connected to ground potential the stimulated emission is prevented from causing laser within said at least one laser, and the forward bias applied to the first active region is varied such that any heat loss or gain due to selectively electrically connecting and disconnecting the second active region to ground potential is approximately equally offset by a heat gain or loss due to varying the bias applied to the first active region.

26. The array of claim 25 wherein the forward bias on said second active region is a direct current.

27. A light emitting device, comprising
an array of monolithically formed independently addressable semiconductor lasers, comprising:
  a semiconductor substrate;
  a plurality of semiconductor layers formed on said substrate such that at least one of said layers forms an active layer of narrower bandgap than layers adjacent thereto;
  a first active region formed in said active layer for each laser, including a two dimensional optical cavity for functioning as a laser; and
  a second active region formed in said active layer of at least one of the lasers of the array, including a two dimensional optical cavity coaxial with said optical cavity of said first active region for functioning as an optical modulator; and
means for applying a variable bias to said first active region;
wherein a sufficient forward bias is applied to said first active region of at least one of the lasers of the array such that stimulated emission is caused to occur therein, a portion of said stimulated emission being directed into said second active region of said at least one laser, the internal loss of the second active region of said at least one laser is varied by varying the bias applied to said first active region such that at a first bias the stimulated emission is prevented from causing lasing within said at least one laser, and at a second bias the stimulated emission is allowed to cause lasing within said at least one laser, and further wherein the forward bias applied to the first active region is varied such that any heat loss or gain due to the lasing or not lasing of said at least one laser is approximately equally offset by a heat gain or loss due to varying the bias applied to the first active region.

28. The light emitting device of claim 27 wherein the forward bias on said first active region is a direct current.

* * * * *